(12) United States Patent
Kim

(10) Patent No.: US 8,889,448 B2
(45) Date of Patent: Nov. 18, 2014

(54) METHOD OF FABRICATING A LIGHT-EMITTING ELEMENT

(71) Applicant: Samsung Electronics Co., Ltd., Suwon-Si, Gyeonggi-Do (KR)

(72) Inventor: Yu-Sik Kim, Seoul (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 9 days.

(21) Appl. No.: 14/035,388

(22) Filed: Sep. 24, 2013

(65) Prior Publication Data
US 2014/0024158 A1     Jan. 23, 2014

Related U.S. Application Data

(63) Continuation of application No. 12/839,800, filed on Jul. 20, 2010, now Pat. No. 8,569,772.

(30) Foreign Application Priority Data

Jul. 20, 2009  (KR) .......................... 10-2009-0065947

(51) Int. Cl.
| | | |
|---|---|---|
| *H01L 21/00* | (2006.01) | |
| *H01L 33/14* | (2010.01) | |
| *H01L 33/42* | (2010.01) | |
| *H01L 33/62* | (2010.01) | |
| *H01L 33/38* | (2010.01) | |
| *H01L 25/075* | (2006.01) | |

(52) U.S. Cl.
CPC ......... *H01L 33/14* (2013.01); *H01L 2933/0016* (2013.01); *H01L 33/42* (2013.01); *H01L 33/62* (2013.01); *H01L 2224/16* (2013.01); *H01L 33/382* (2013.01); *H01L 25/0753* (2013.01); *H01L 33/387* (2013.01); *Y10S 257/918* (2013.01)

USPC .............. 438/42; 257/82; 257/918; 257/676; 257/E33.001

(58) Field of Classification Search
USPC .......... 257/918, 82, 676, E33.001, 91–93, 98, 257/E33.057, E33.056, E33.062
See application file for complete search history.

(56) References Cited

U.S. PATENT DOCUMENTS

| | | | |
|---|---|---|---|
| 6,201,265 B1 * | 3/2001 | Teraguchi ........................ | 257/99 |
| 2006/0163596 A1 * | 7/2006 | Kim et al. ........................ | 257/98 |

(Continued)

FOREIGN PATENT DOCUMENTS

| | | |
|---|---|---|
| JP | 2001223386 A | 8/2001 |
| KR | 20040013394 A | 2/2004 |
| KR | 20070079528 A | 8/2007 |

*Primary Examiner* — Julio J Maldonado
*Assistant Examiner* — Robert Bachner
(74) *Attorney, Agent, or Firm* — Harness, Dickey & Pierce, P.L.C.

(57) ABSTRACT

Provided are a light-emitting element and a method of fabricating the same. The light-emitting element includes: a first pattern including conductive regions and non-conductive regions. The non-conductive regions are defined by the conductive regions. The light-emitting element also include an insulating pattern including insulating regions and non-insulating regions which correspond respectively to the conductive regions and non-conductive regions. The non-insulating regions are defined by the insulating regions. The light-emitting element further includes a light-emitting structure interposed between the first pattern and the insulating pattern. The light-emitting structure includes a first semiconductor pattern of a first conductivity type, a light-emitting pattern, and a second semiconductor pattern of a second conductivity type which are stacked sequentially. The light-emitting element also includes a second pattern formed in the non-insulating regions.

11 Claims, 20 Drawing Sheets

(56) References Cited

U.S. PATENT DOCUMENTS

| | | | |
|---|---|---|---|
| 2007/0181895 A1* | 8/2007 | Nagai | 257/98 |
| 2008/0142824 A1* | 6/2008 | Chen et al. | 257/98 |
| 2009/0289273 A1* | 11/2009 | Tsai et al. | 257/98 |
| 2009/0309514 A1* | 12/2009 | Kim | 315/291 |
| 2010/0041170 A1* | 2/2010 | Epler et al. | 438/26 |

* cited by examiner

METHOD OF FABRICATING A LIGHT-EMITTING ELEMENT

This application is a continuation application of U.S. application Ser. No. 12/839,800, filed on Jul. 20, 2010 (now allowed), which claims priority to Korean Patent Application No. 10-2009-0065947, filed on Jul. 20, 2009, in the Korean Intellectual Property Office, the disclosure of each of which is incorporated herein by reference in its entirety.

BACKGROUND

1. Field of the Invention

Example embodiments relate to a light-emitting element and a method of fabricating the same. More particularly, example embodiments relate to a light-emitting element and a method of fabricating the same, in which spreading of a current in a light-emitting structure is increased or maximized to increase utilization of an active layer and to improve optical efficiency.

2. Description of the Related Art

Light-emitting elements such as light-emitting diodes (LEDs) emit light when electrons combine with holes. Light-emitting elements have lower power consumption, have a long life, are installable in a limited space, and are resistant to vibrations.

A light-emitting element may include a p electrode, an n electrode, and a light-emitting pattern which generates light using a current flowing from the p electrode to the n electrode. Depending on the design of the light-emitting element, not all regions of the light-emitting pattern may be used. That is, a current may flow through only some regions of the light-emitting element and not through other regions. For example, a current may flow through only some regions (i.e., regions located on the path of the current) of the light-emitting pattern which are closer to the p electrode and the n electrode. Accordingly, light may be generated in only part of the light-emitting pattern, thereby deteriorating optical efficiency of the light-emitting element.

This has led to a demand for a structure which allows a current to flow through more of the regions of a light-emitting pattern, so that light can be generated in more of the regions of the light-emitting pattern.

SUMMARY

Example embodiments of the present invention provide a light-emitting element in which spreading of a current in a light-emitting structure is increased and/or maximized to increase utilization of an active layer and to improve optical efficiency.

Example embodiments of the present invention also provide a method of fabricating a light-emitting element, in which spreading of a current in a light-emitting structure is increased and/or maximized to increase utilization of an active layer and to improve optical efficiency.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present inventive concepts, there is provided a light-emitting element including: a first pattern including conductive regions and non-conductive regions. The non-conductive regions are defined by the conductive regions. The light-emitting element also includes an insulating pattern including insulating regions and non-insulating regions which correspond respectively to the conductive regions and non-conductive regions. The non-insulating regions are defined by the insulating regions. The light-emitting element further includes a light-emitting structure interposed between the first pattern and the insulating pattern. The light-emitting structure includes a first semiconductor pattern of a first conductivity type, a light-emitting pattern, and a second semiconductor pattern of a second conductivity type which are stacked sequentially. Additionally, the light-emitting element may include a second pattern formed in the non-insulating regions.

According to another aspect of the present inventive concepts, there is provided a method of fabricating a light-emitting element. The method includes: forming a first pattern, which includes conductive regions and non-conductive regions on a substrate. The non-conductive regions are defined by the conductive regions. The method also includes forming a light-emitting structure on the substrate having the first pattern by sequentially stacking a first semiconductor pattern of a first conductivity type, a light-emitting pattern, and a second semiconductor pattern of a second conductivity type. The method further includes forming an insulating pattern on the light emitting structure. The insulating pattern includes insulating regions and non-insulating regions. The non-insulating regions are defined by the insulating regions. The method may also include forming a second pattern in the non-insulating regions. The insulating regions of the second pattern correspond respectively to the conductive regions of the first pattern.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

Figure 1A:
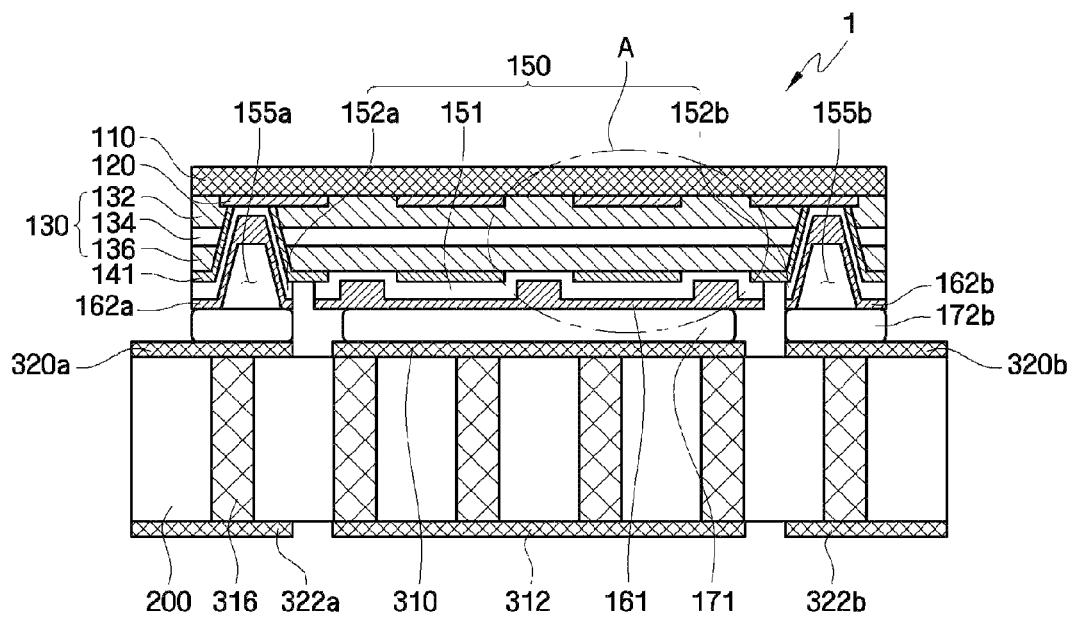
FIG. 1A is a cross-sectional view of a light-emitting element according to an example embodiment.

Advantages and features of the present invention and methods of accomplishing the same may be understood more readily by reference to the following detailed description of exemplary embodiments and the accompanying drawings.

The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated components, steps, operations, and/or elements, but do not preclude the presence or addition of one or more other components, steps, operations, elements, and/or groups thereof. As used herein, the term "and/or" includes any and all combinations of one or more of the associated listed items. Like numbers refer to like elements throughout.

It will be understood that, although the terms first, second, third, etc., may be used herein to describe various elements, components and/or sections, these elements, components and/or sections should not be limited by these terms. These terms are only used to distinguish one element, component or section from another element, component or section. Thus, a first element, component or section discussed below could be termed a second element, component or section without departing from the teachings of the present invention.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present.

Spatially relative terms, such as "below," "beneath," "lower," "above," "upper," and the like, may be used herein for ease of description to describe one device or element's relationship to another device(s) or element(s) as illustrated in the drawings. It will be understood that the spatially relative terms are intended to encompass different orientations of the device in use or operation in addition to the orientation depicted in the drawings. Like numbers refer to like elements throughout.

Embodiments of the invention are described herein with reference to (plan and) cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, example embodiments will be described in detail with reference to the accompanying drawings.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 4:
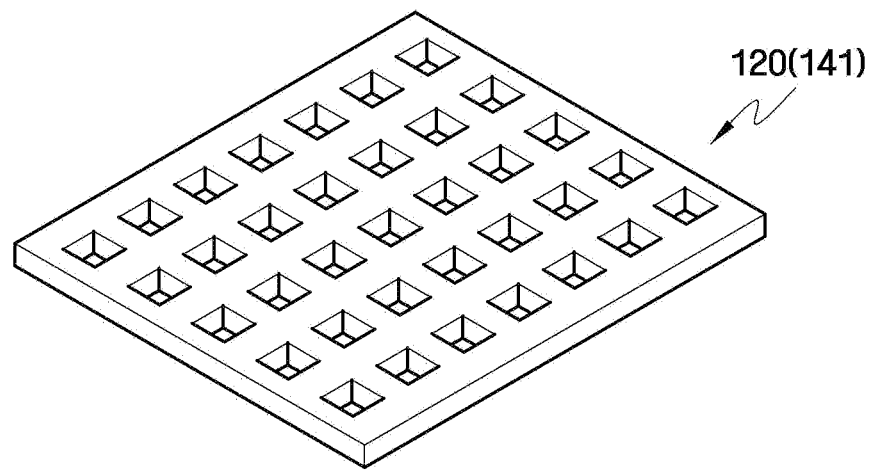
Figure 5:
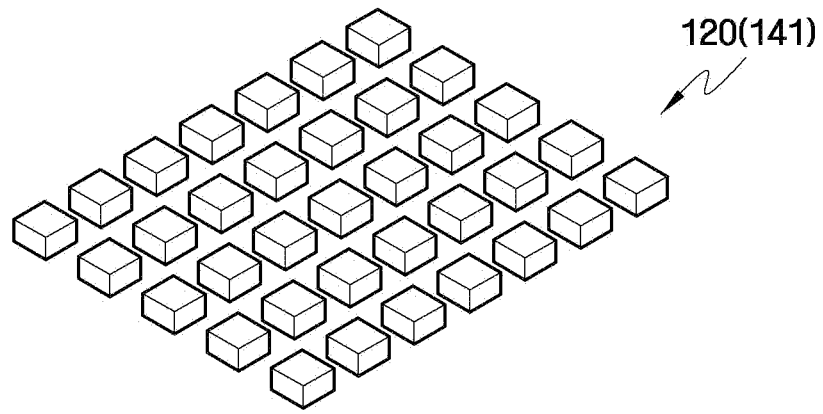
Figure 6:
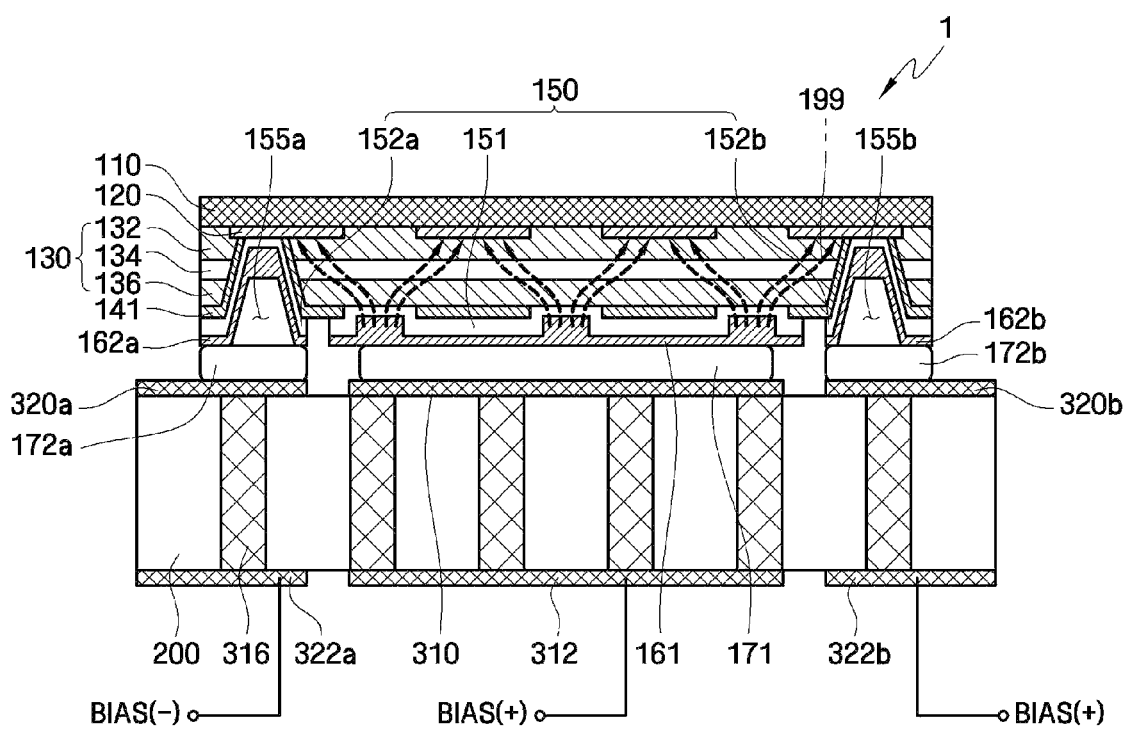
FIG. 6 is a view showing the operation of the light-emitting element according to an example embodiment.

FIGS. 1A through 6 are views showing a light-emitting element 1 according to an example embodiment. Specifically, FIG. 1A is a cross-sectional view of the light-emitting element 1 according to the first exemplary embodiment of the present invention. FIG. 1B is an enlarged view of a region 'A' shown in FIG. 1A. FIGS. 2 through 5 are views showing exemplary shapes of a first pattern 120 and an insulating pattern 141 used in the light-emitting element 1 according to the first exemplary embodiment of the present invention. FIG. 6 is a view showing the operation of the light-emitting element 1 according an example embodiment.

Referring to FIG. 1, the light-emitting element 1 according to a first exemplary embodiment includes a light-emitting structure 130 which generates light. Light-emitting element 1 may also include first and second patterns 120 and 150 which are respectively disposed on both surfaces of the light-emitting structure 130 to supply power to the light-emitting structure 130. Light-emitting element 1 may also include an insulating pattern 141 which is disposed between the light-emitting structure 130 and the second pattern 150 to regulate, guided or control the path of a current flowing through the light-emitting structure 130. The path of the current flowing through the light-emitting structure 130 may be regulated or controlled by the shape of the first pattern 120 and the shape of the insulating pattern 141.

In the following description of each component of the light-emitting element 1 and a process of fabricating the same, the same component may be described as being located at opposite or different positions. For example, while the first pattern 120 is formed on the light-emitting structure 130 in FIG. 1A, it is formed under the light-emitting structure 130 in FIGS. 23 through 28. That is, the positional relationship of each component with another component is not absolute but relative.

Each component of the light-emitting element 1 will now be described in detail. The second pattern 150 includes a first region 151 which contacts the light-emitting structure 130 and second regions 152a and 152b which contact the first pattern 120 through contact holes 155a and 155b, respectively. The first region 151 and the second regions 152a and 152b serve as a passage through which a bias is applied to each of a first semiconductor pattern 132 and a second semiconductor pattern 136. The second pattern 150 is disposed under the light-emitting structure 130 and is made of a material with higher reflectivity in order to improve efficiency of light generated by the light-emitting structure 130. The second pattern 150 may be made of at least one of silver (Ag) and aluminum (Al).

At least part of the first region 151 and at least part of each of the second regions 152a and 152b may be formed on the same layer, and biases with different polarities may be applied respectively to the first region 151 and the second regions 151a and 151b.

The insulating pattern 141 is disposed on the second pattern 150 and is formed to expose part of the second pattern 150.

Figure 1B:
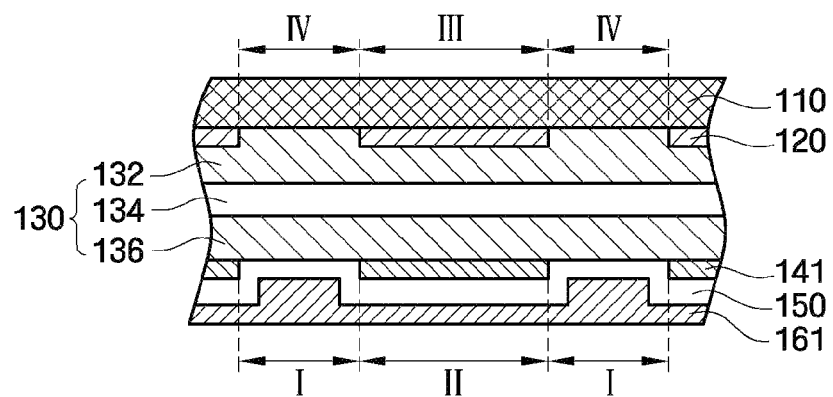
FIG. 1B is an enlarged view of a region 'A' shown in FIG. 1A.

Referring to FIG. 1B, the insulating pattern 141 includes non-insulating regions I which are formed by patterning an insulating film (indicated by reference numeral 140 in FIG. 25) to expose the second pattern 150 and insulating regions II in which the insulating film remains. The non-insulating regions I may be defined by the insulating regions II. That is, regions other than regions in which the insulating film remains may be the non-insulating regions I. The insulating pattern 141 may be, but is not limited to, an oxide, a nitride, or an oxynitride.

The insulating regions II of the insulating pattern 141 are formed to correspond respectively to conductive regions III of the first pattern 120. That is, the insulating regions II of the insulating pattern 141 may be substantially as wide as the conductive regions III of the first pattern 120. However, the width of the insulating regions II is not necessarily equal to that of the conductive regions III. The widths of the insulating regions II and the conductive regions III can be modified, changed or adjusted in view of, for example, the thickness of the light-emitting structure 130. The relationship between the insulating regions II and the conductive regions III will be described later in greater detail when the first pattern 120 is described.

Figure 2:
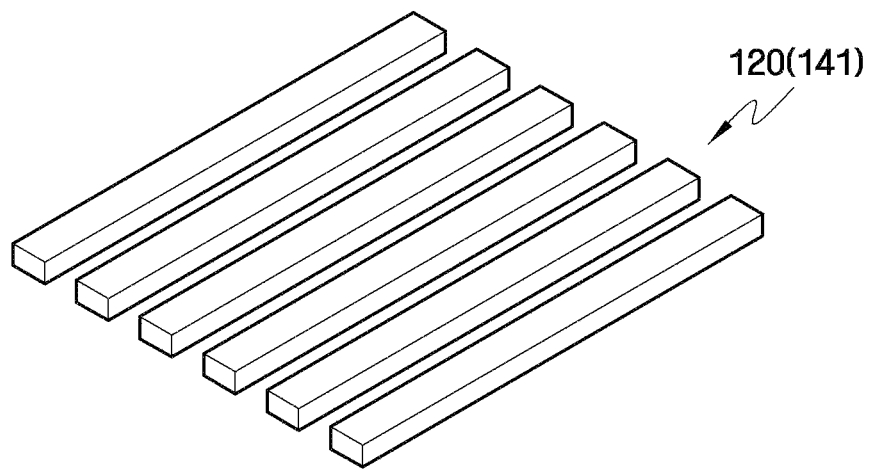
FIGS. 2 through 5 are views showing exemplary shapes of a first pattern and an insulating pattern used in the light-emitting element according to an example embodiment.
Figure 3:
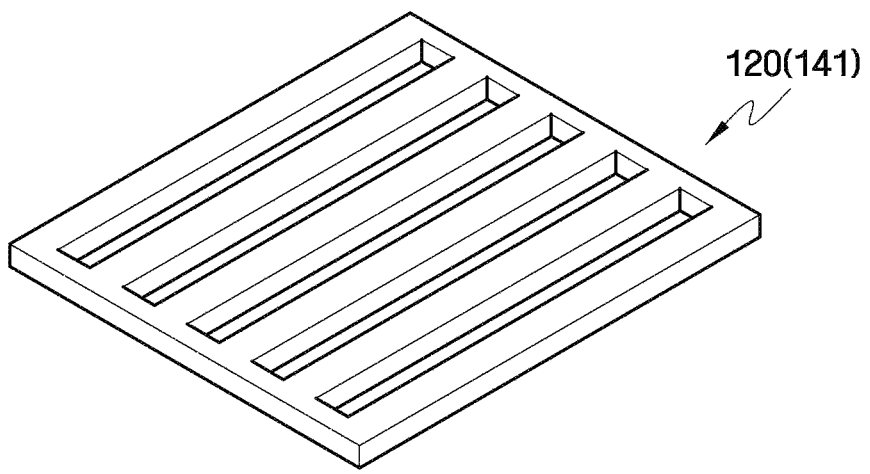

The insulating regions II and the non-insulating regions I may have various shapes and insulation patterns. For example, the insulating regions II may be in the form of a an insulation pattern 141(a) with a plurality of parallel lines as shown in FIG. 2, or the non-insulating regions I may be an insulation pattern 141(b) patterned linearly as shown in FIG. 3. Alternatively, the insulating regions II may be in an insulation pattern 141(c) mesh form as shown in FIG. 4 or in an insulation pattern 141(d) dotted form as shown in FIG. 5.

Referring back to FIG. 1B, the second pattern 150 extends in the non-insulating regions I. The non-insulating regions I may serve as passages through which the second pattern 150 directly contacts the light-emitting structure 130.

The light-emitting structure 130 is formed on the insulating pattern 141 and the second pattern 150. The light-emitting structure 130 includes the second semiconductor pattern 136, a light-emitting pattern 134, and the first semiconductor pattern 132 stacked sequentially, wherein the second semiconductor pattern 136 is of a second conductivity type (e.g., a p type), and the first semiconductor pattern 132 is of a first conductivity type (e.g., an n type).

Each of the second semiconductor pattern 136, the light-emitting pattern 134, and the first semiconductor pattern 132 may contain $In_xAl_yGa_{(1-x-y)}N$ ($0 \le x \le 1$, $0 \le y \le 1$) (i.e., various materials containing GaN). For example, each of the second semiconductor pattern 136, the light-emitting pattern 134, and the first semiconductor pattern 132 may be AlGaN or InGaN.

Specifically, the light-emitting pattern 134 is a region where light is generated when carriers (e.g., electrons) of the first semiconductor pattern 132 combine with carriers (e.g., holes) of the second semiconductor pattern 136. Although not specifically shown in the drawing, the light-emitting pattern 134 may include a well layer and a barrier layer. Since the well layer has a smaller band gap than the barrier layer, carriers (electrons and holes) gather in the well layer and combine together. The light-emitting pattern 134 may have a single quantum well (SQW) structure or a multiple quantum well (MQW) structure, depending on the number of well layers. The SQW structure includes only one well layer while the MQW structure includes a plurality of well layers. In order to control light-emitting properties, at least one of the well layer and the barrier layer may be doped with at least one of boron (B), phosphorous (P), silicon (Si), magnesium (Mg), zinc (Zn), selenium (Se), and aluminum (Al).

Referring to FIG. 1B, the first pattern 120 is formed on the first semiconductor pattern 132. The first pattern 120 includes the conductive regions III and non-conductive regions IV. The conductive regions III are regions in which a conductive film is disposed or exists, and the non-conductive regions IV are regions from which the conductive film is etched or removed after being patterned. The non-conductive regions IV may be defined by the conductive regions III. Conversely, it can be understood that the conductive regions III are defined by the non-conductive regions IV.

The first pattern 120 may be made of a transparent conductor to allow light generated by the light-emitting structure 130 to pass there through. The transparent conductor may be, but is not limited to, CrN, indium tin oxide (ITO), indium zinc oxide (InZnO), or zinc oxide (ZnO).

As described above, the first pattern 120 may have the same shape as the insulating pattern 141. For example, the conductive regions III may include first pattern 120(a) in the form of a plurality of parallel lines as shown in FIG. 2, or the non-insulating regions IV may be in the form of first pattern 120(b) patterned linearly as shown in FIG. 3. Alternatively, the conductive regions III may be formed of the first pattern 120(c) in a mesh form as shown in FIG. 4 or may be the first pattern 120(d) formed in a dotted form as shown in FIG. 5.

As described above, the conductive regions III of the first pattern 120 may be formed to correspond respectively to the insulating regions II of the insulating pattern 141. That is, the first pattern 120(a)-(d) may have substantially the same shape as the insulating pattern 141(a)-(d). However, the shape of the first pattern 120 may not necessarily be the same as that of the insulating pattern 141. While major parts of the insulating pattern 141 of the first pattern 120 have the same shapes as those of the conductive regions III of the insulating pattern 141, the other parts of the insulating pattern 141 of the first pattern 120 may have different shapes from those of the conductive regions III of the insulating pattern 141.

The conductive regions III of the first pattern 120 receive a bias and serve as current paths. That is, a current flows between the conductive regions III of the first pattern 120 and the second pattern 150 in the non-insulating regions I. Here, the current generates light as it passes through the light-emitting structure 130 between the first pattern 120 and the second pattern 150.

The path of the current flowing through the light-emitting structure 130 should be wider to increase the light generation efficiency of the light-emitting structure 130. Here, the path of the current flowing through the light-emitting structure 130 can be guided or controlled by the shapes of the first pattern 120 and the insulating pattern 141. To increase spreading of the current flowing through the light-emitting structure 130, the conductive regions III of the first pattern 120 may be formed to overlap the insulating regions II of the insulating pattern 141. The conductive regions III and the insulating regions II may be substantially the same regions, and the insulating regions II may be wider than the conductive regions III. The conductive regions III of the first pattern 120 may not overlap the non-insulating regions I of the insulating pattern 141. This is to reduce, limit or prevent a reduction in the length of the path of the current flowing through the light-emitting structure 130.

A buffer layer 110 may be formed on the first pattern 120. The buffer layer 110 serves as a seed layer if the first semiconductor pattern 132 is formed (grown). If the buffer layer 110 is used as a seed layer, crystalline properties of the first semiconductor pattern 132, the light-emitting pattern 134, and the second semiconductor pattern 136 can be enhanced. The buffer layer 110 may be made of any material that enables the buffer layer 110 to serve as a seed layer. For example, the buffer layer 110 may be $In_xAl_yGa_{(1-x-y)}N$ ($0 \le x \le 1$, $0 \le y \le 1$) or $Si_xC_yN_{(1-x-y)}$ ($0 \le x \le 1$, $0 \le y \le 1$).

The buffer layer 110 contacts the first semiconductor pattern 132 through the non-conductive regions IV of the first pattern 120. The first semiconductor pattern 132 may be formed by lateral epitaxial overgrowth using the buffer layer 110, which is exposed through the non-conductive regions IV, as a seed layer. If the first semiconductor pattern 132, the light-emitting pattern 134, and the second semiconductor pattern 136 are formed by lateral epitaxial overgrowth, the light-emitting structure 130 with fewer imperfections or defects can be obtained.

The contact holes 155a and 155b may be formed in the light-emitting structure 130. The contact holes 155a and 155b penetrate the light-emitting structure 130 to expose at least part of the conductive regions III of the first pattern 120. In the light-emitting structure 130, one or more contact holes 155a and 155b may be formed.

Each of the contact holes 155a and 155b is a passage through which a bias is applied to the first pattern 120. The insulating pattern 141 is formed in the contact holes 155a and 155b. Specifically, the insulating pattern 141 is formed in each of the contact holes 155a and 155b by patterning the insulating film to expose a region of the first pattern 120. Here, the insulating film in a region of each of the contact holes 155a and 155b other than a region corresponding to the exposed region of the first pattern 120 is not patterned in order to not expose the first semiconductor pattern 132, the light-emitting pattern 134, and the second semiconductor pattern 136.

The second regions 152a and 152b of the second pattern 150 are connected to the first pattern 120 by the contact holes 155a and 155b, respectively. As described above, the first region 151 of the second pattern 150 contacts the second semiconductor pattern 136, and the second regions 152a and 152b are connected to the first pattern 120. Accordingly, opposite biases are applied to the first region 151 and the second regions 152a and 152b, thereby supplying power to the light-emitting structure 130.

The second pattern 150 may be bonded onto a circuit substrate 200 by bonding pads 161, 162a and 162b. A first wiring pattern 310 and second wiring patterns 320a and 320b are disposed on a first surface of the circuit substrate 200 and are electrically insulated from each other. In addition, a third wiring pattern 312 and fourth wiring patterns 322a and 322b are disposed on a second surface of the circuit substrate 200 and are electrically insulated from each other. The first wiring pattern 310 and the second wiring patterns 320a and 320b disposed on the first surface of the circuit substrate 200 are connected respectively to the third wiring pattern 312 and the fourth wiring patterns 322a and 322b formed on a second surface of the circuit substrate 200 by through-vias 316. The first wiring pattern 310 is electrically connected to the first region 151 of the second pattern 150, and the second wiring patterns 320a and 320b are electrically connected to the first pattern 120 by the second regions 152a and 152b of the second pattern 150.

The bonding pads 161, 162a and 162b may be interposed between the circuit substrate 200 and the second pattern 150. The bonding pads 161, 162a and 162b enable the second pattern 150 to be more easily bonded to the first wiring pattern 310 and the second wiring patterns 320a and 320b. The bonding pads 161, 162a and 162b may contain at least one of ITO, Zn, ZnO, Ag, titanium (Ti), Al, aurum (Au), nickel (Ni), indium oxide ($In_2O_3$), tin oxide ($SnO_2$), copper (Cu), tungsten (W), and platinum (Pt). The bonding pads 161, 162a an 162b can limit or decrease crowding of a current flowing from the first wiring pattern 310 and the second wiring patterns 320a and 320b to the second pattern 150 while increasing spreading of the current.

Intermediate material layers 171, 172a and 172b may be disposed between the circuit substrate 200 and the bonding pads 161, 162a and 162b. The intermediate material layers 171, 172a and 172b are a material used to bond the circuit substrate 200 and the bonding pads 161, 162a and 162b. The intermediate material layers 171, 172a and 172b may be a conductive material, e.g., a metal layer. The intermediate material layers 171, 172a and 172b disposed as a metal layer may contain at least one of Au, Ag, platinum (Pt), Ni, Cu, tin (Sn), Al, plumbum (Pb), chrome (Cr), and Ti. That is, the metal layer may be a single layer of Au, Ag, Pt, Ni, Cu, Sn, Al, Pb, Cr or Ti, may be a laminate of the above materials, or may be a combination of the above materials. For example, the metal layer may be a single Au layer, a double Au/Sn layer, or a multi-layer formed by alternately stacking Au and Sn a number of times.

As shown in the drawings, the light-emitting element 1 according to an example embodiment is a flip-chip type light-emitting element fabricated using a flip-chip bonding technique. However, the type of the light-emitting element 1 is not limited to the flip-chip type and may also be a lateral type. Modified examples of the light-emitting element 1 will be described later in other exemplary embodiments.

Although not shown in the drawings, a texture may be formed on the surface of the first semiconductor pattern 132. Due to the difference between refractive indices of the first semiconductor pattern 132 and air, light incident at angles other than an escape cone angle is trapped in the first semiconductor pattern 132. However, the texture allows the light to escape from the first semiconductor pattern 312, thereby improving light extraction efficiency.

A bias flow in the light-emitting structure 130 is directed or controlled by the first pattern 120 and the insulating pattern 141, which will now be described with reference to FIG. 6.

Referring to FIG. 6, if the second semiconductor pattern 136 is of the p type while the first semiconductor pattern 132 is of the n type, a bias (V+ or I+) is applied to the second semiconductor pattern 136 through the first region 151 of the second pattern 150, and another bias (V−, I−, or a ground) is applied to the first semiconductor pattern 132 through the second regions 152a and 152b of the second pattern 150 and the first pattern 120. That is, the bias (V+ or I+) is applied to the second semiconductor pattern 136, and the bias (V−, I− or the ground) is applied to the first semiconductor pattern 132, thereby forward-biasing the light-emitting structure 130. The forward bias causes the light-emitting pattern 134 to generate light. The generated light may dissipate or escape from the light-emitting structure 130 after being reflected by the second pattern 150 or may dissipate or escape directly from the light-emitting structure 130 without being reflected.

If the light-emitting structure 130 is forward-biased, a current 199 flows from the first region 151 of the second pattern 150 to the first pattern 120. In the light-emitting structure 130 the non-conductive regions IV of the first pattern 120 and the insulating regions II of the insulating pattern 141 included in the light-emitting element 1 according to the first exemplary embodiment control the path of the current 199 flowing through the light-emitting structure 130. That is, the non-conductive regions IV of the first pattern 120 and the insulating regions II of the insulating pattern 141 spread or disperse the flow of the current 199 in the light-emitting structure 130.

Specifically, the current 199 flows from the second regions 152a and 152b of the second pattern 150 into the light-emitting structure 130. Here, since the current 199 cannot pass through the insulating regions II of the insulating pattern 141, it flows into the light-emitting structure 130 through the non-insulating regions I. Then, the current 199 flows or passes through the light-emitting structure 130 and flows to the conductive regions III of the first pattern 120. That is, the current 199 flows along a path consisting of the second regions 152a and 152b of the second pattern 150, the light-emitting structure 130, and the conductive regions III of the first pattern 120. Accordingly, the current 199 can be guided, directed or controlled to pass through almost all regions of the light-emitting pattern 134 by modifying or adjusting the second regions 152a and 152b of the second pattern 150 and the conductive regions III of the first pattern 120.

In particular, if the conductive regions III of the first pattern 120 correspond respectively to the insulating regions II of the insulating pattern 141, the current 199 can be controlled to flow through almost all regions of the light-emitting pattern 134. Since almost all regions of the light-emitting pattern 134 can be utilized by modifying or adjusting the conductive regions III of the first pattern 120 and the insulating regions II of the insulating pattern 141, optical efficiency of the light-emitting element 1 can be maximized.

Figure 7:
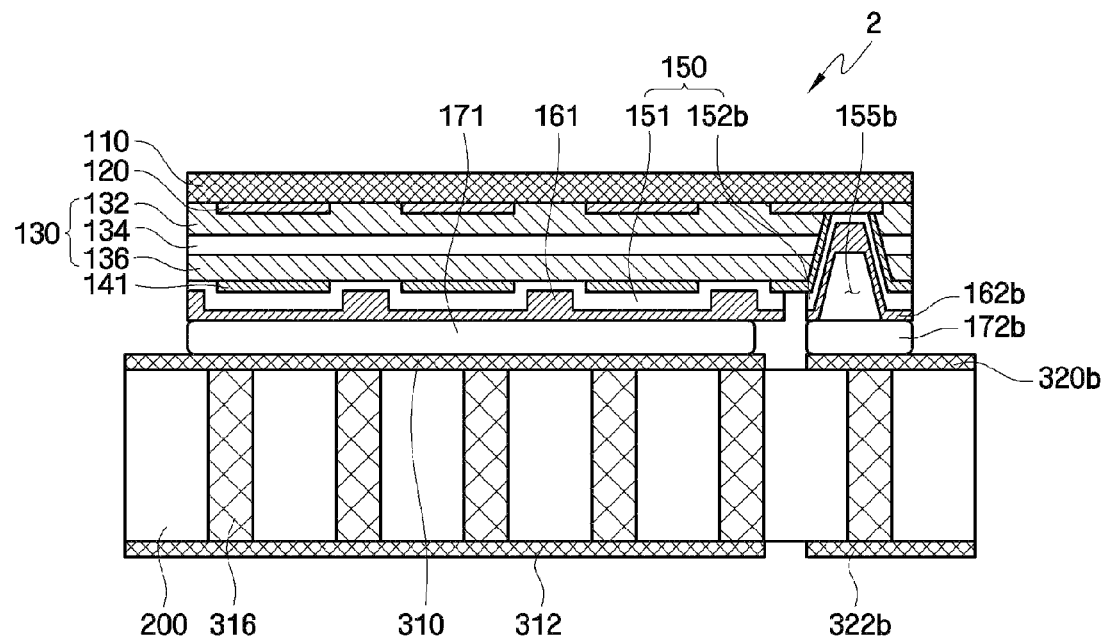
FIGS. 7-9 illustrate a cross-sectional view of a light-emitting element according to different example embodiments.

FIG. 7 is a cross-sectional view of a light-emitting element 2 according to an example embodiment of the present invention. The light-emitting element 2 according to the second exemplary embodiment is substantially the same as the light-emitting element 1 according to the first exemplary embodiment except that a first pattern 2120 is connected to a second wiring pattern 2320b by one contact hole 2155b.

As described above, the contact hole 2155b serves as a passage through which the second wiring pattern 2320b of a circuit substrate 2200 is electrically connected to the first pattern 2120. That is, a bias applied to a first semiconductor pattern 2132 passes through the contact hole 2155b and the first pattern 2120. When a power source is connected to at least part of the first pattern 2120, the power source is electrically connected to the first pattern 2120 due to the nature of current. However, when the first pattern 2120 is electrically connected to the power source, not all regions of the first pattern 2120 can be current paths. Therefore, a current may be guided or controlled to pass through almost all regions of the first pattern 120 by adequately modified or adjusting the number and positions of contact holes.

In previous example embodiments, the light-emitting element 2 having one contact hole 2155b and the light-emitting element 1 having two contact holes 155a and 155b have been described to explain that the number of contact holes can be adjusted as desired. Thus, the positions and number of contact holes 155a, 155b and 2115b can be modified or adjusted by considering the area and thickness of a light-emitting element and pattern an interval between the conductive regions III of the first pattern 120 and an interval between the insulating regions II of the insulating pattern 141.

The contact holes 155a, 155b and 2115b formed in the light-emitting elements 1 and 2 allow the first regions 151 and 2151 and the second regions 152a, 152b and 2155b of the second patterns 150 and 2150 to be formed as one surface, respectively. That is, a process such as wire bonding is not required to fabricate the light-emitting elements 1 and 2, and no space for wire bonding is required. This offers a spatial advantage when a light-emitting device is packaged.

Figure 8:
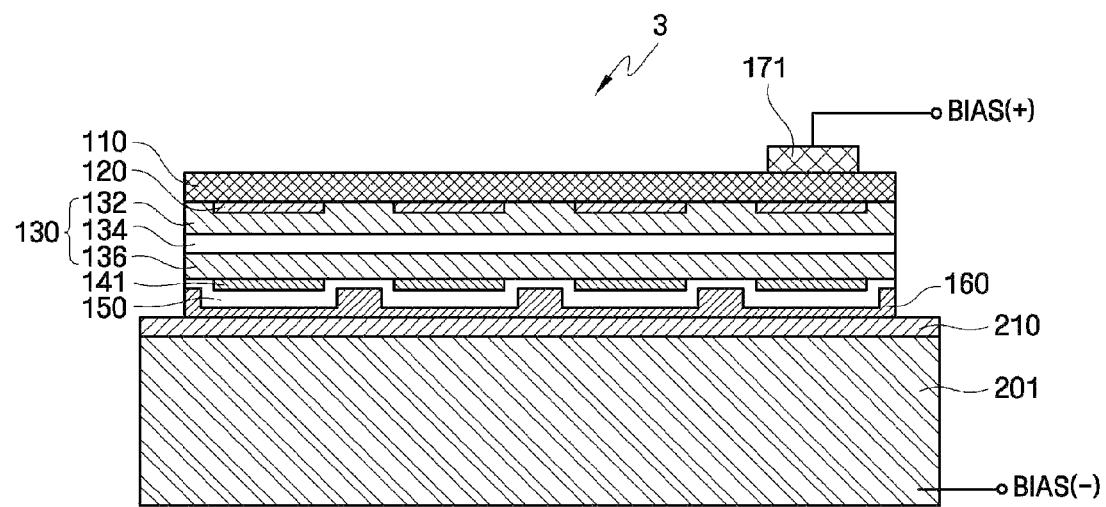

FIG. 8 is a cross-sectional view of a light-emitting element 3 according an example embodiment. The light-emitting element 3 does not include contact holes and receives a bias through a first electrode 3171 formed on a buffer layer 3110.

The first electrode 3171 is on the buffer layer 3110 and is electrically connected to a first semiconductor pattern 3132. The first electrode 3171 may be on a side of a light-emitting structure 3130 to avoid obstructing the path of light generated within the light-emitting structure 3130. The first electrode 3171 may contain at least one of ITO, Cu, Ni, Cr, Au, Ti, Pt, Al, vanadium (V), tungsten (W), molybdenum (Mo), and Ag.

A bonding pad 3160 may be bonded onto a conductive substrate 3201 by an intermediate material layer 3210. The conductive substrate 3201 may have conductivity and may be one of Si, strained Si, a Si alloy, silicon-on-insulator (SOI), silicon carbide (SiC), silicon germanium (SiGe), silicon germanium carbide (SiGeC), silicon aluminum (Si—Al), germanium (Ge), a germanium (Ge) alloy, gallium arsenide (GaAs), indium arsenide (InAs), an III-V semiconductor, and an II-VI semiconductor. Alternatively, the conductive substrate 3201 may be a combination of the above materials or a laminate of the above materials.

Figure 9:
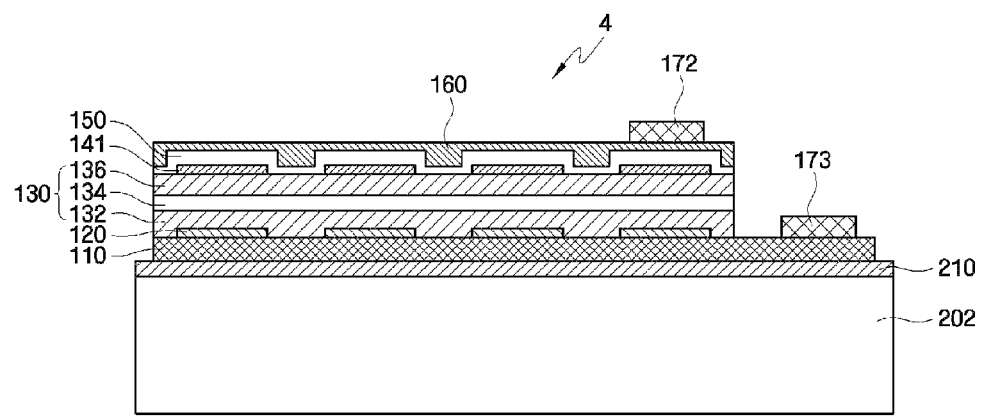

FIG. 9 is a cross-sectional view of a light-emitting element 4 according to a an example embodiment.

The light-emitting element 4 according to the fourth exemplary embodiment includes a light-emitting structure 4130 formed on a substrate 4202. The light-emitting structure 4130 includes a first semiconductor pattern 4132 of the first conductivity type, a light-emitting pattern 4134, and a second semiconductor pattern 4136 of the second conductivity type which are stacked sequentially. Since the light-emitting element 4 is of a lateral type. That is, both of a first electrode 4173 and a second electrode 4172 are on the same side of the substrate 4202 with the light-emitting structure 4130.

The substrate 4202 may be made of any material from which the light-emitting structure 4130 can expand or grow. For example, the substrate 4202 may be an insulating substrate made of sapphire ($Al_2O_3$) or zinc oxide (ZnO) or may be a conductive substrate made of silicon (Si) or silicon carbide (SiC).

In particular, a first pattern 4120 may be on the substrate 4202, an insulating pattern 4141 may be on the light-emitting structure 4130, and a second pattern 4150 may be on the insulating pattern 4141. That is, the structure of the light-emitting element 4 according an example embodiment may be the reverse of the structures of the light-emitting elements 1 and 2 according to example embodiments detailed above.

The first electrode 4173 may be on a buffer layer 4110, and the second electrode 4172 may be on the second pattern 4150 or a bonding pad 4160.

Hereinafter, light-emitting devices fabricated using one of the above-described light-emitting elements 1 through 4 will be described. For simplicity, light-emitting devices using the light-emitting element 1 according to an example embodiment are illustrated in the drawings. However, the scope of the present inventive concepts and example embodiments are not limited thereto. It is obvious that those of ordinary skill in the art to which the present example embodiments of inventive concepts can also construct similar light-emitting devices using any one of the light-emitting elements 2 through 4 according to the example embodiments.

Figure 10:
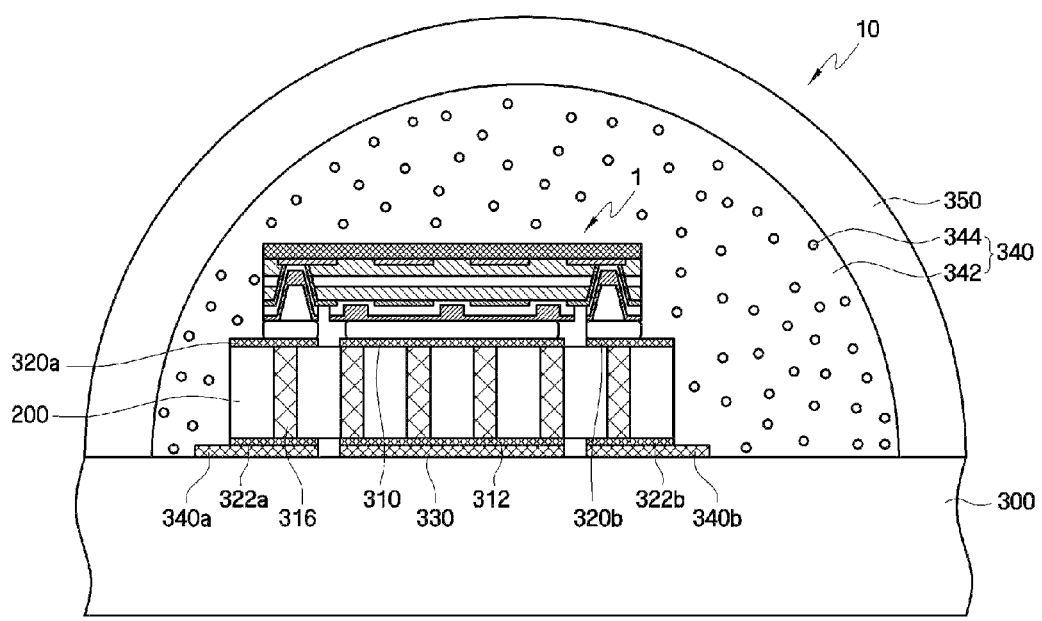
FIGS. 10-12 illustrate a view showing a light-emitting device according to other different example embodiments.

FIG. 10 is a view showing a light-emitting device 10 according to an example embodiment.

Referring to FIG. 10, the light-emitting device 10 according to the first exemplary embodiment includes a circuit substrate 300 and the light-emitting element 1 disposed on the circuit substrate 300.

The circuit substrate 300 includes a first conductive pattern 330 and second conductive patterns 340a and 340b. The first conductive pattern 330 is electrically insulated from the second conductive patterns 340a and 340b. The first and second conductive patterns 330, 340a, and 340b are disposed on a surface of the circuit substrate 300.

The first conductive pattern 330 and the second conductive patterns 340a and 340b are connected, such as through an electrical connection, respectively to the second wiring pattern 312 and the fourth wiring patterns 322a and 322b formed on the circuit substrate 200 of the light-emitting element 1.

The light-emitting device 10 includes a phosphor layer 340 which surrounds the light-emitting element 1 and second transparent resin 350. The phosphor layer 340 may be a mixture of first transparent resin 342 and phosphors 344. The phosphors 344 dispersed within the phosphor layer 340 absorbs light emitted from the light-emitting element 1 and modifies or converts the wavelength of the light. Thus, as the phosphors 344 are dispersed more evenly, the light-emitting properties of the light-emitting device 10 can be improved. In addition, if the phosphors 344 are dispersed more evenly, the wavelength conversion and color-mixing effect of the phosphors 344 can be enhanced. The phosphor layer 340 may be disposed such that the light-emitting device 10 may emits white light. For example, if the light-emitting element 1 emits light having a blue wavelength, the phosphors 344 may include yellow phosphors. The phosphors 344 may also include red phosphors in order to increase a color-rendering index (CRI). If the light-emitting element 1 emits light having an ultraviolet (UV) wavelength, the phosphors 344 may include all of red, green and blue phosphors.

The first transparent resin 342 can be any material that can distribute, arrange or disperse the phosphors 344 in a stable manner. For example, the first transparent resin 342 may be epoxy resin, silicon resin, hard silicon resin, denatured silicon resin, urethane resin, oxetane resin, acrylic resin, polycarbonate resin, or polyimide resin.

The phosphors 344 can be any material that can absorb light from the light-emitting structure 110 and modifies or converts the wavelength of the absorbed light. For example, the phosphors 344 may be at least one of nitride-based or oxynitride-based phosphors activated mainly by a lanthanoid element such as europium (Eu) or cerium (Ce); alkaline earth halogen apatite phosphors activated mainly by a lanthanoid element such as Eu or a transition metal element such as manganese (Mn); alkaline earth metal halogen borate phosphors; alkaline earth metal aluminate phosphors; alkaline earth silicate phosphors; alkaline earth sulfide phosphors; alkaline earth thiogallate phosphors; alkaline earth silicon nitride phosphors; germanate phosphors; rare earth aluminate phosphors activated mainly by a lanthanoid element such as Ce; rare earth silicate phosphors; and organic or organic complex phosphors activated mainly by a lanthanoid element such as Eu. The materials listed above may be used as the phosphors 344. However, the phosphors 344 are not limited to the following examples.

Furthermore, other phosphors that offer similar performance and effects to those of the phosphors listed above can be used.

The second transparent resin 350 is lens-shaped and diffuses light emitted from the light-emitting element 1. The curvature and flatness of the second transparent resin 350 may be adjusted to control the light diffusion/extraction properties thereof. The second transparent resin 350 surrounds the phosphor layer 340 to protect the phosphor layer 340. This is because the properties of the phosphor layer 340 may deteriorate when the phosphor layer 340 comes into contact with, for example, moisture.

The second transparent resin 350 can be any material that allows light to pass therethrough. For example, the second transparent resin 350 may be epoxy resin, silicon resin, hard silicon resin, denatured silicon resin, urethane resin, oxetane resin, acrylic resin, polycarbonate resin, or polyimide resin.

Figure 11:
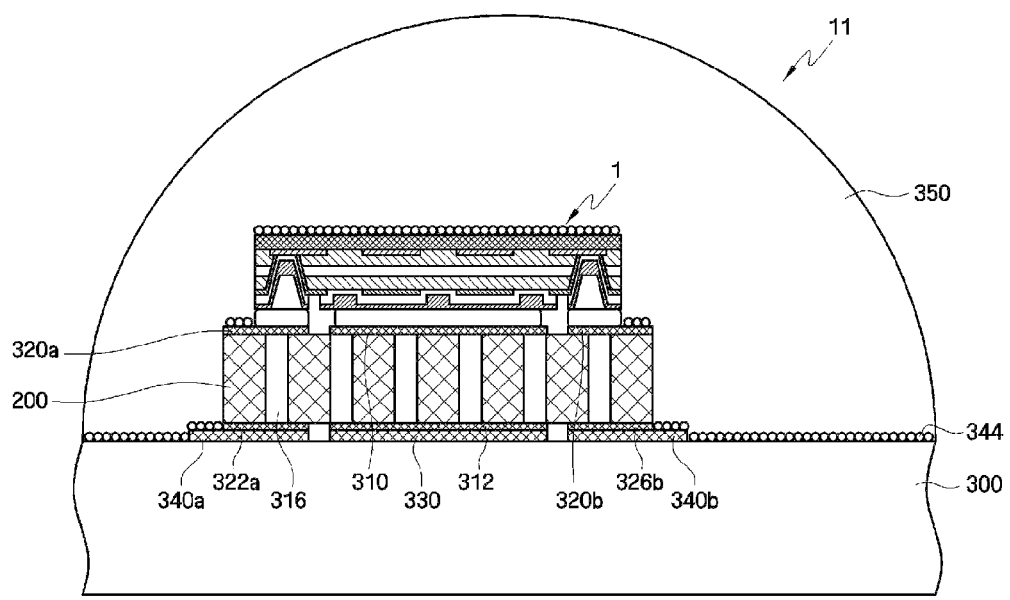

FIG. 11 is a view showing a light-emitting device 11 according to an example embodiment.

Referring to FIG. 11, phosphors 344 are formed along the profiles of the light-emitting element 1 and a circuit substrate 300. The phosphors 344(a) may be coated on the light-emitting element 1 and the circuit substrate 300 without requiring first transparent resin (indicated by reference numeral 342 in FIG. 10).

If the phosphors 344(a) are coated on the light-emitting element 1 and the circuit substrate 300 without the first transparent resin, only a single layer of transparent resin may surround the light-emitting element 1.

Figure 12:
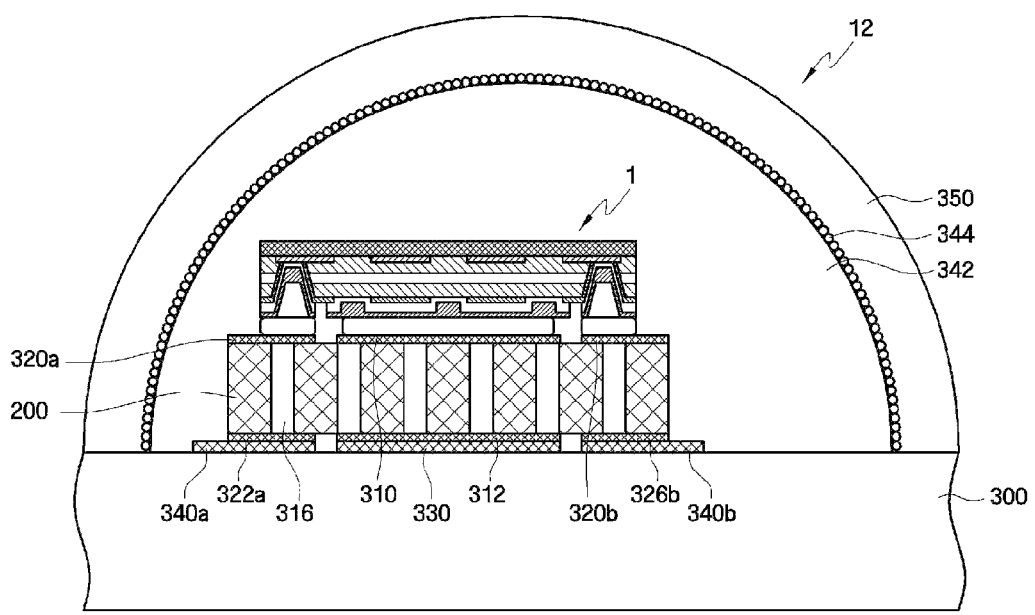

FIG. 12 is a view showing a light-emitting device 12 according to another example embodiment.

Referring to FIG. 12, the light-emitting device 12 according to the example embodiment may be different from the light-emitting device 11 according to other example embodiments in that it includes first transparent resin 342 which surrounds the light-emitting element 1, phosphors 344(b) which are formed on the first transparent resin 342, and second transparent resin 5350 which is formed on the phosphors 344.

That is, since the first transparent resin 342 and the phosphors 344(b) are coated separately without being mixed with each other, the phosphors 344(b) can be formed more thinly and conformally along a surface of the first transparent resin 342.

Figure 13:
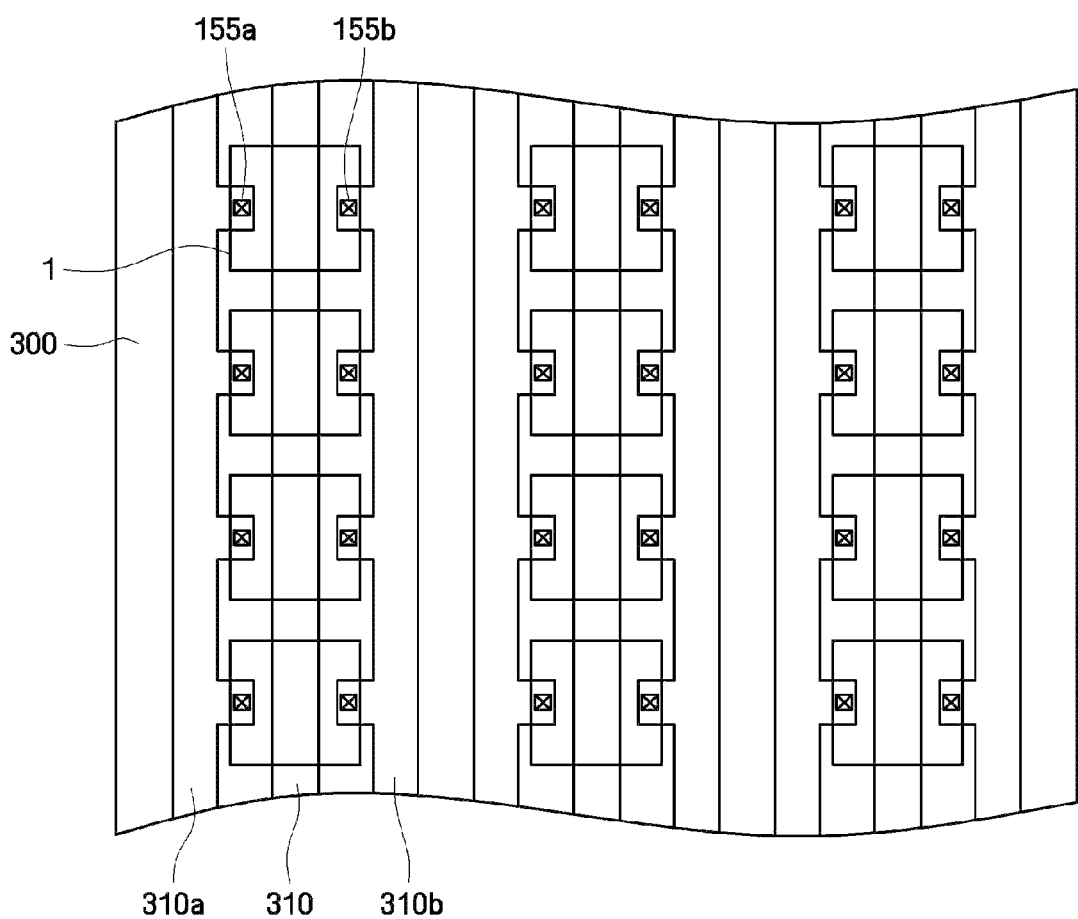
FIGS. 13 through 15 are views showing light-emitting devices according to still further example embodiments.
Figure 14:
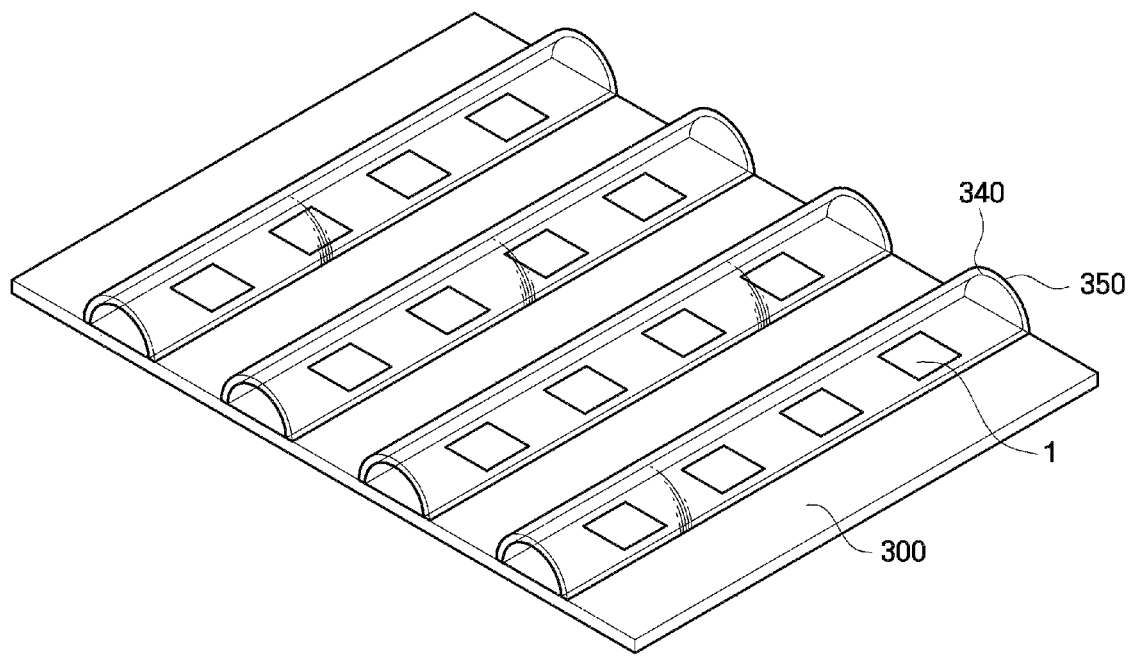
Figure 15:
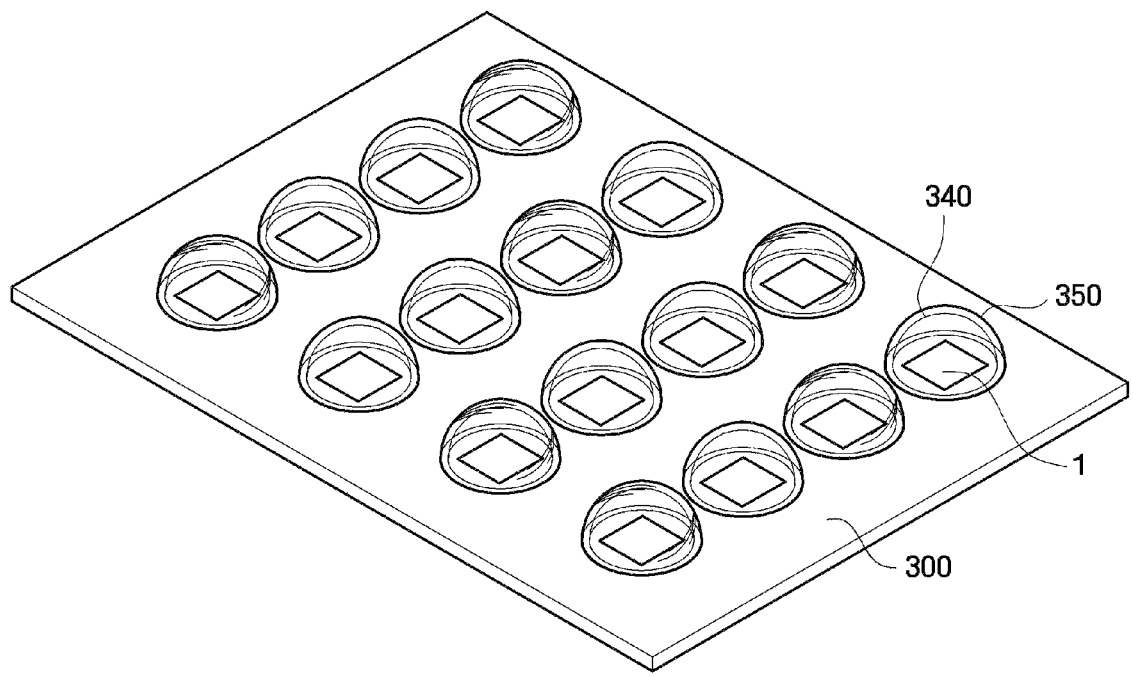

FIGS. 13 through 15 are views showing light-emitting devices according to example embodiments.

FIGS. 13 through 15 are views showing an array of the light-emitting elements 1 disposed on a circuit substrate 300. In particular, FIGS. 14 and 15 show phosphor layers 340 and second transparent resins 350 which are formed on the array of the light-emitting elements 1.

Referring to FIG. 13, a first conductive pattern 310 and second conductive patterns 310a and 310b are on the circuit substrate 300 and extend in one direction to be parallel to each other. A plurality of light-emitting elements 1 are disposed on the first and second conductive patterns 310, 310a and 310b and are arranged in a line in the direction in which the first and second conductive patterns 310, 310a and 310b extend. As described above, the light-emitting elements 1 may be mounted on the first and second conductive patterns 310, 310a and 310b by flip-chip bonding.

If the light-emitting structure 130 (see FIG. 1) of each of the light-emitting elements 1 is forward-biased by applying a bias (e.g., V+ or I+) to the first conductive pattern 310 and applying another bias (e.g., V−, I−, or the ground) to the second conductive patterns 310a and 310b, the light-emitting elements 1 may emit light.

Referring to FIG. 14, the phosphor layers 340(a) and the second transparent resin layers 350(a) may be in a linear pattern. For example, if the light-emitting elements 1 are arranged along the direction in which first conductive pattern 310 extend, the phosphor layers 340(a) and the second transparent resin layers 350(a) may also be arranged along the direction in which the first conductive pattern 310 extends. In addition, the phosphors 340(a) and the second transparent resin layers 350(a) may surround all of the first conductive patterns 310 and second conductive patterns 310a, 310b.

Referring to FIG. 15, the phosphor layers 340(b) and the second transparent resin 350(b) may be formed in a dotted manner. In this case, each of the phosphor layers 340(b) and each layer of the second transparent resin 350(b) may encompass or surround a corresponding one of the light-emitting elements 1.

Figure 16:
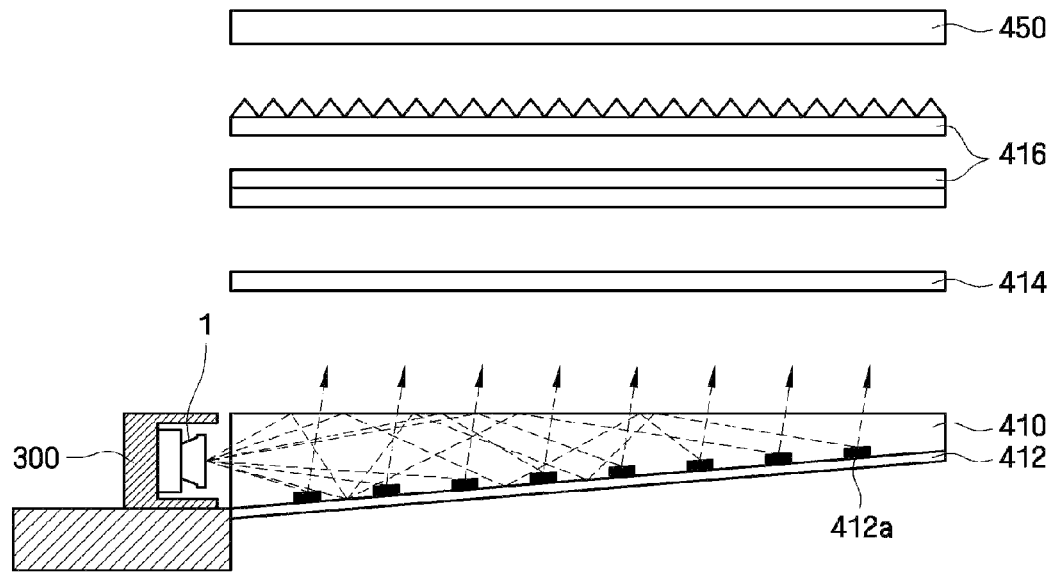
FIG. 16 is a view showing a light-emitting device according to an example embodiment.

FIG. 16 is a view showing a light-emitting device according to a another example embodiment.

The light-emitting device shown in FIG. 16 is an end product. The light-emitting device of FIG. 16 can be applied to various apparatuses such as lighting apparatuses, display apparatuses, and mobile apparatuses (mobile phones, MP3 players, navigation systems, etc.). The light-emitting device shown in FIG. 16 is an edge-type backlight unit (BLU) used in a liquid crystal display (LCD). Since LCDs do not include a light source, they use a BLU as their light source. Generally, a BLU is disposed behind a liquid crystal panel and provides light to the liquid crystal panel.

Referring to FIG. 16, the BLU includes the light-emitting element 1, a light guide plate 410, a reflective plate 412, a diffusion sheet 414, and a pair of prism sheets 416.

The light-emitting element 1 provides light. The light-emitting element 1 used in FIG. 16 may be of a side-view type.

The light guide plate 410 guides light to a liquid crystal panel 450. The light guide plate 410 is a panel made of a transparent plastic material such as acryl and guides light emitted from the light-emitting element 1 to the liquid crystal panel 450 which is disposed above the light guide plate 410. Thus, various patterns 412a are printed in a lower surface of the light guide plate 410 to guide light, which is input to the light guide plate 410, toward the liquid crystal panel 450.

The reflective plate 412 is disposed under the light guide plate 410 and reflects light, which is emitted downward from the light guide plate 410, in an upward direction. That is, the reflective plate 412 reflects light, which may have not been reflected by the various patterns 412a printed in the lower surface of the light guide plate 410, toward an output surface of the light guide plate 410. In so doing, the reflective plate 412 reduces light loss and improves the uniformity of light which is output from the output surface of the light guide plate 410.

The diffusion sheet 414 diffuses light output from the light guide plate 410, thereby reducing, limiting or preventing the light from being concentrated in a specific area.

Each of the prism sheets 416 has a required, desired or predetermined array of triangular prisms on an upper surface thereof. The prism sheets 416 typically consist of two sheets, and an array of triangular prisms formed on one of the two prism sheets 416 cross an array of triangular prisms formed on the other one of the two prism sheets 416 at a required, desired or predetermined angle, so that light diffused by the diffusion sheet 414 can proceed in a direction substantially perpendicular to the liquid crystal panel 450.

FIGS. 17 through 20 are views showing light-emitting devices according to example embodiments of the present invention.

Figure 17:
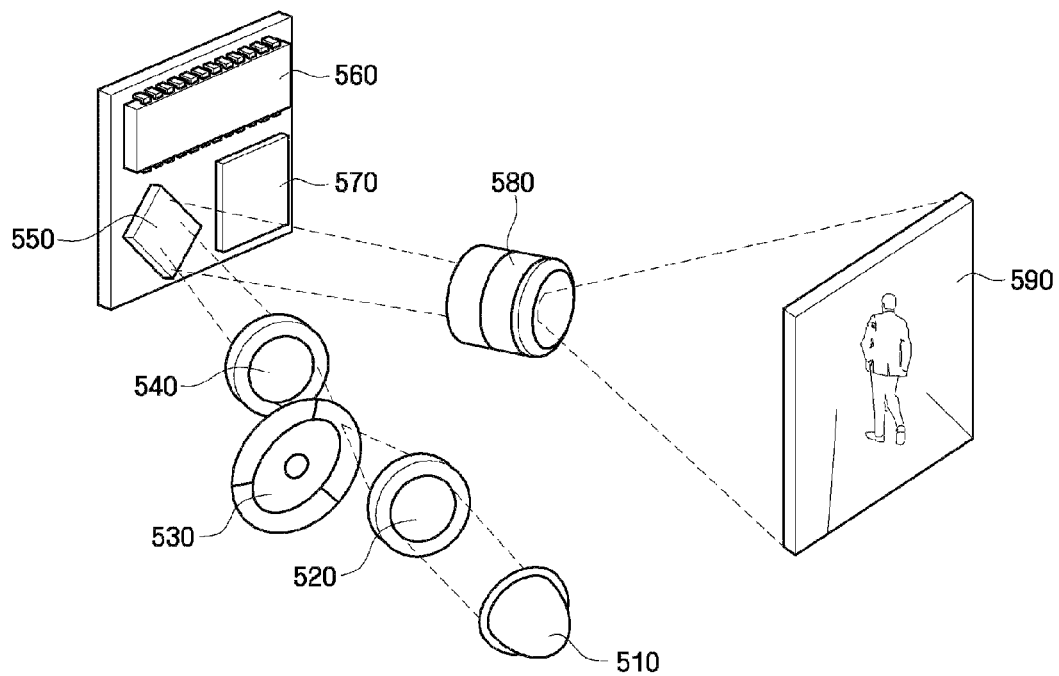
FIGS. 17 through 20 are views showing light-emitting devices according to example embodiments.
Figure 18:
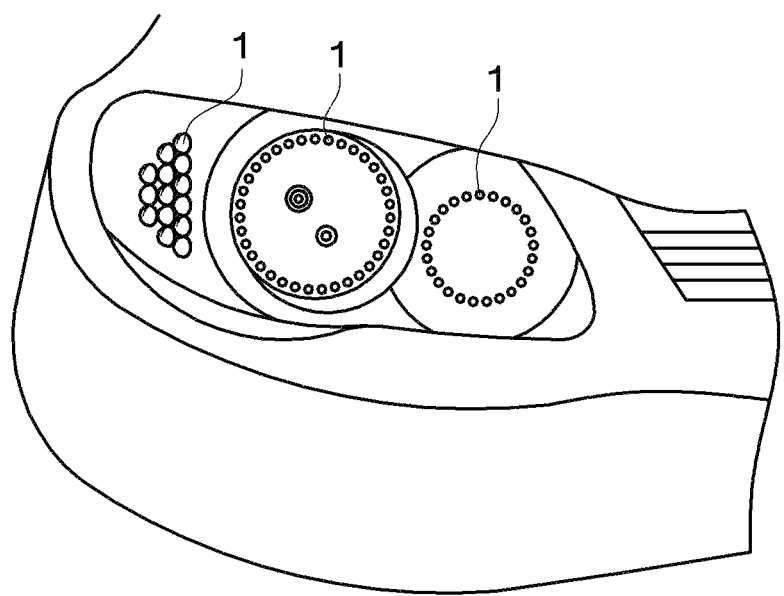
Figure 19:
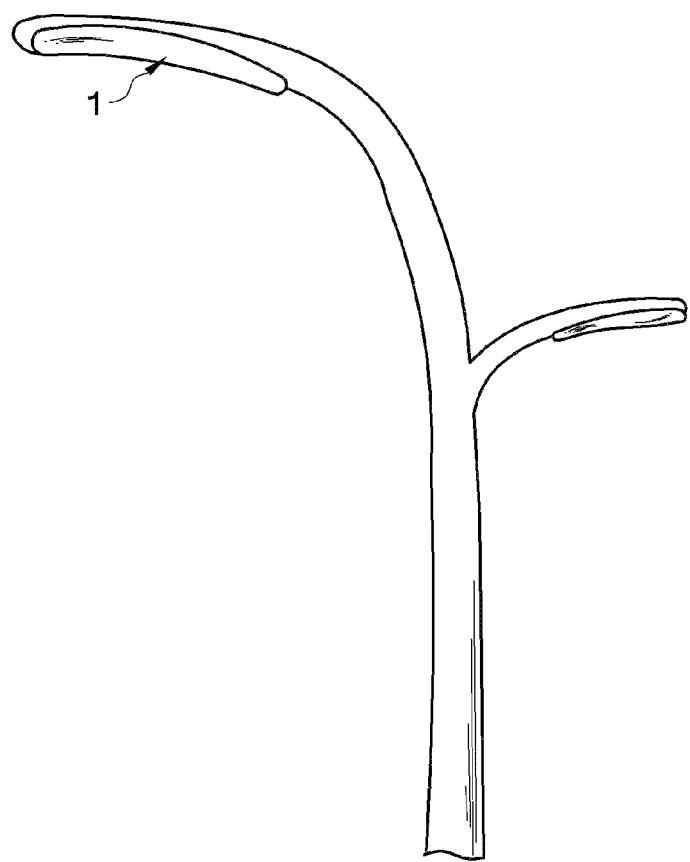
Figure 20:
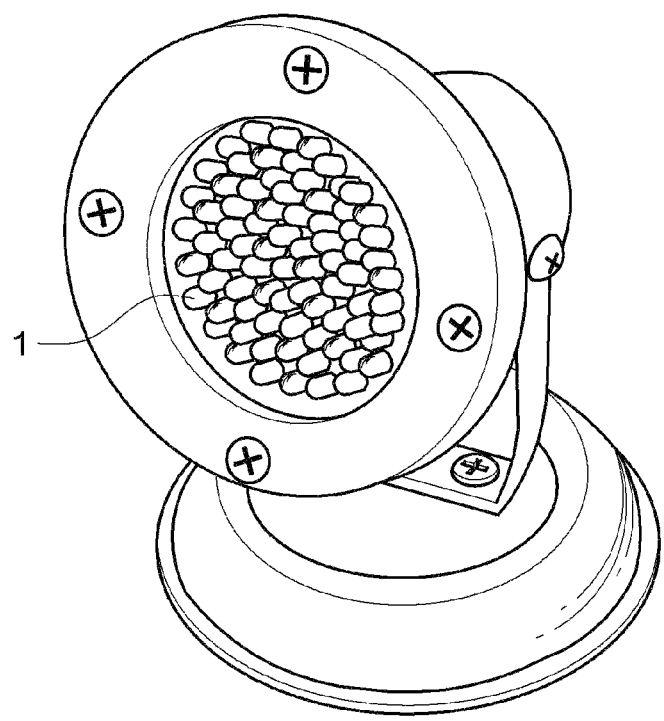

The light-emitting devices shown in FIGS. 17 through 20 are exemplary end products to which the light-emitting element 1 described above has been applied. Specifically, FIG. 17 shows a projector, FIG. 18 shows a headlight of a vehicle, FIG. 19 shows a streetlight, and FIG. 20 shows a lamp. The light-emitting element 1 used in the light-emitting devices of FIGS. 17 through 20 may be of a top-view type.

Referring to FIG. 17, light emitted from a light source 510 passes through a condensing lens 520, a color filter 530, and a sharpening lens 540. Then, the light is reflected by a digital micro-mirror device 550 and passes through a projection lens 580 to reach a screen 590. A light-emitting element according to the present invention is included in the light source 510.

FIGS. 21 through 28 are views showing intermediate processes included in a method of fabricating a light-emitting element according to an example embodiment the present invention.

Figure 21:
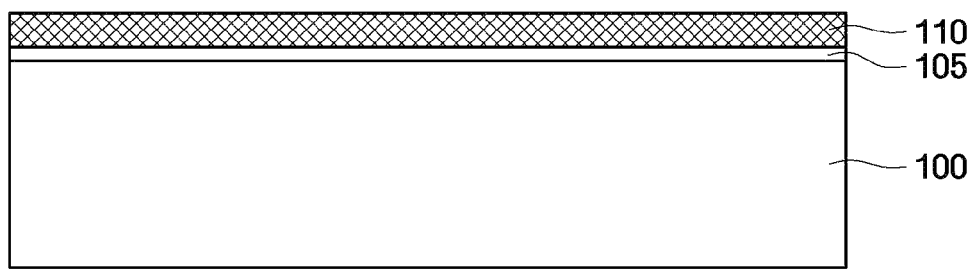
FIGS. 21 through 30 are views showing intermediate processes included in a method of fabricating a light-emitting element according to an example embodiment.

Referring to FIG. 21, a sacrificial layer 105 and a buffer layer 110 are sequentially formed on an $Al_2O_3$ substrate 100.

The sacrificial layer 105 is etched when the substrate 100 is lifted off using a laser lift-off (LLO) technique. The sacrificial layer 105 may be a GaN layer.

The buffer layer 110 may serve as a seed layer when a first semiconductor pattern 132 is formed (grown). The buffer layer 110 may be $In_xAl_yGa_{(1-x-y)}N$ (0≤x≤1, 0≤y≤1) or $Si_xC_yN_{(1-x-y)}$ (0≤x≤1, 0≤y≤1). The buffer layer 110 can limit or reduce defects in the crystalline structure of a light-emitting structure 130 formed on the buffer layer 110.

Figure 22:
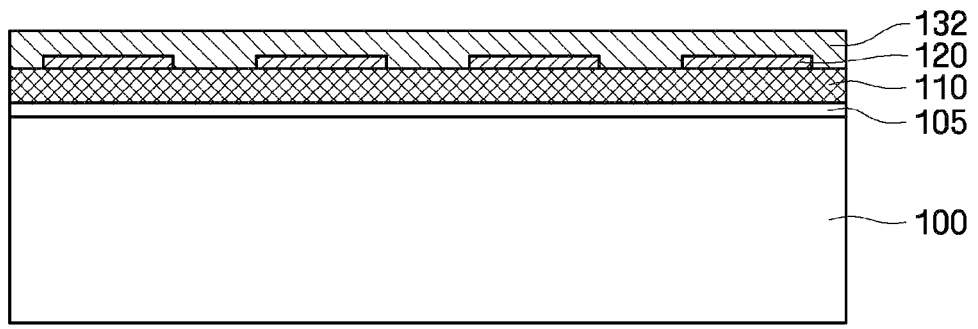

Referring to FIG. 22, a first pattern 120 and a first semiconductor pattern 132 are sequentially formed on the buffer layer 110.

The first pattern 120 may be made of a transparent conductor as described above and may be formed to include conductive regions III and non-conductive regions IV. The first semiconductor pattern 132 is formed on the buffer layer 110 having the first pattern 120. The first semiconductor pattern 132 may be formed by lateral epitaxial overgrowth using the non-conductive regions IV of the first pattern 120 as a seed layer.

Figure 23:
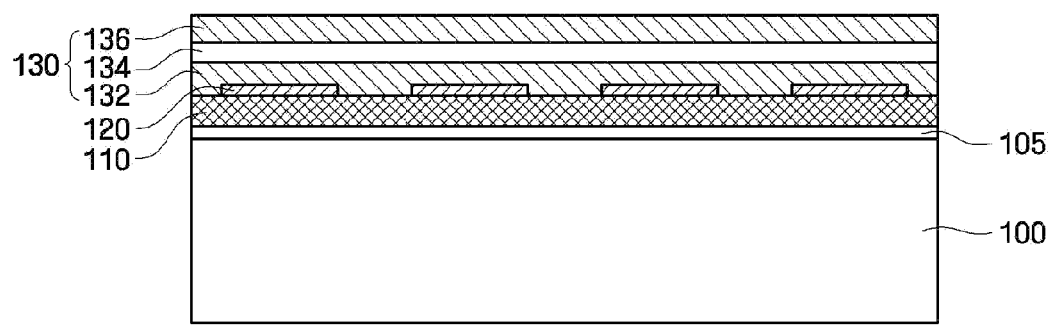

Referring to FIG. 23, a light-emitting pattern 134 and a second semiconductor pattern 136 are sequentially disposed on the first semiconductor pattern 132. Each of the first semiconductor pattern 132, the light-emitting pattern 134, and the second semiconductor pattern 136 may contain $In_xAl_yGa_{(1-x-y)}N$ (0≤x≤1, 0≤y≤1). That is, each of the first semiconductor pattern 132, the light-emitting pattern 134, and the second semiconductor pattern 136 may be, e.g., AlGaN or InGaN.

After the second semiconductor pattern 136 is formed, an annealing process may be performed to activate the semiconductor pattern 136. For example, the second semiconductor pattern 136 may be annealed at approximately 400° C. Specifically, if the second semiconductor pattern 136 is $In_xAl_yGa_{(1-x-y)}N$ doped with Mg, the annealing process may cause H attached to Mg to be detached. As a result, the second semiconductor pattern 136 may exhibit p-type characteristics.

Figure 24:
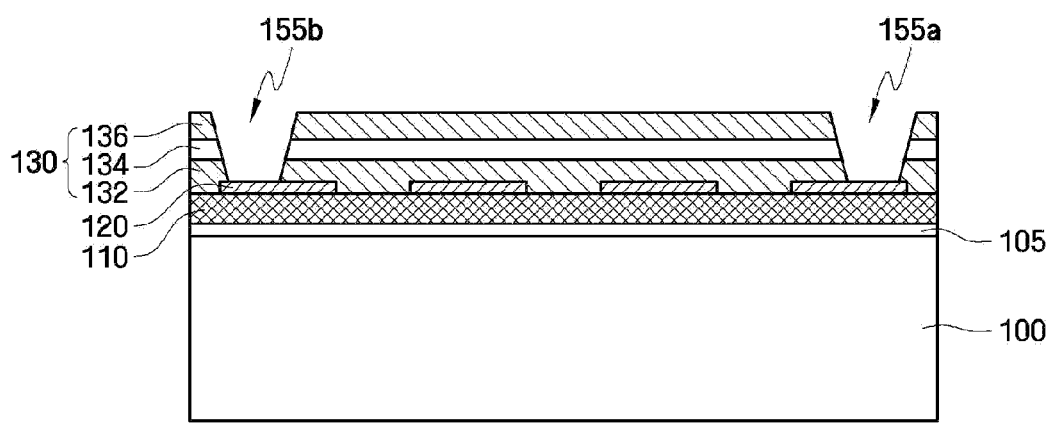

Referring to FIG. 24, contact holes 155a and 155b are disposed to penetrate the first semiconductor pattern 132, the light-emitting pattern 134, and the second semiconductor pattern 136. The contact holes 155a and 155b expose the first pattern 120.

As described above, the contact holes 155a and 155b serve as passages through which a bias is applied to the first pattern 120. Thus, the positions and number of the contact holes 155a and 155b may be adjusted variously.

Figure 25:
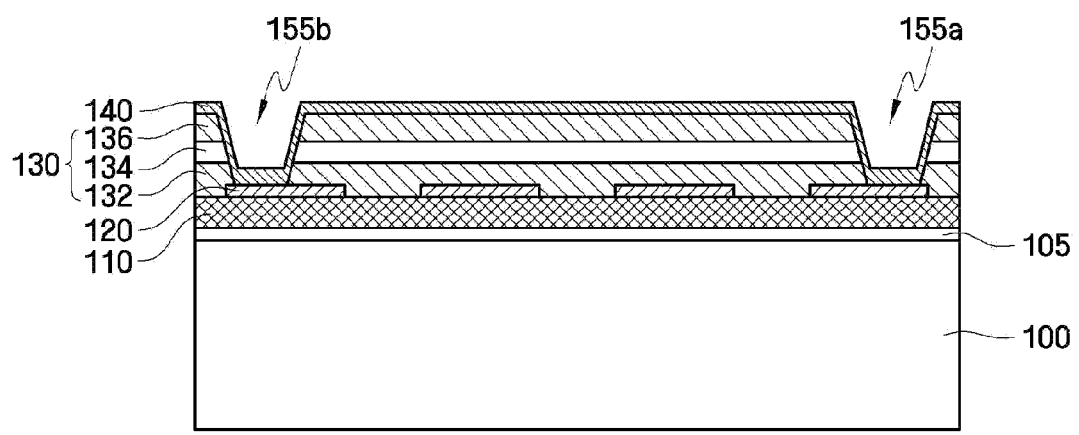

Referring to FIG. 25, an insulating film 140 is formed on the first semiconductor pattern 132, the light-emitting pattern 134, and the second semiconductor pattern 136.

The insulating film 140 is formed not only on the second semiconductor pattern 136 but also in the contact holes 155a and 155b for complete insulation. The insulating film 140 may be, but is not limited to, an oxide, a nitride, or an oxynitride.

Figure 26:
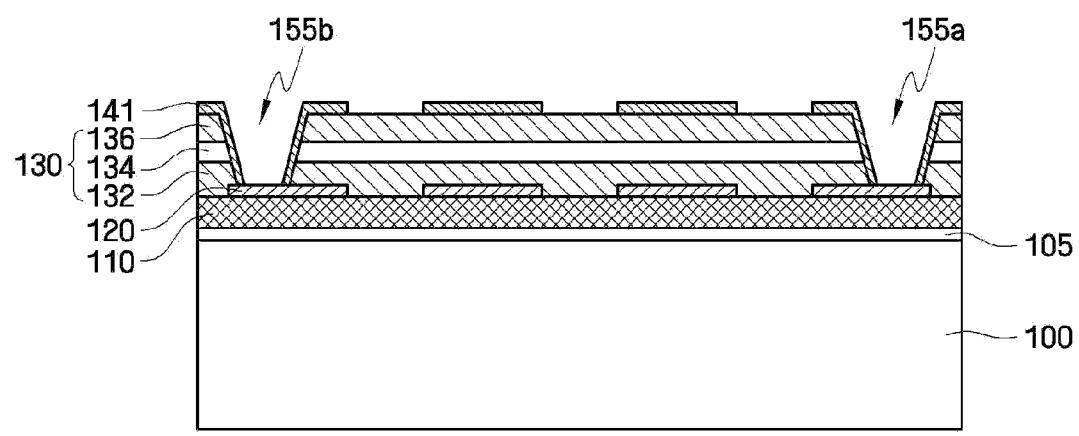

Referring to FIG. 26, the insulating film 140 formed on the light-emitting structure 130 is patterned to form an insulating pattern 141.

As described above, the insulating film 140 is patterned such that insulating regions II of the insulating pattern 141 overlap conductive regions III of the first pattern 120. The insulating film 140 in each of the contact holes 155a and 155b is patterned to expose at least part of the first pattern 120. Here, of the insulating film 140 in each of the contact holes 155a and 155b, regions overlapping the first semiconductor pattern 132, the light-emitting pattern 134, and the second semiconductor pattern 136 excluding a region overlapping the first pattern 120 are left unpatterned to serve as the insulating regions II.

Figure 27:
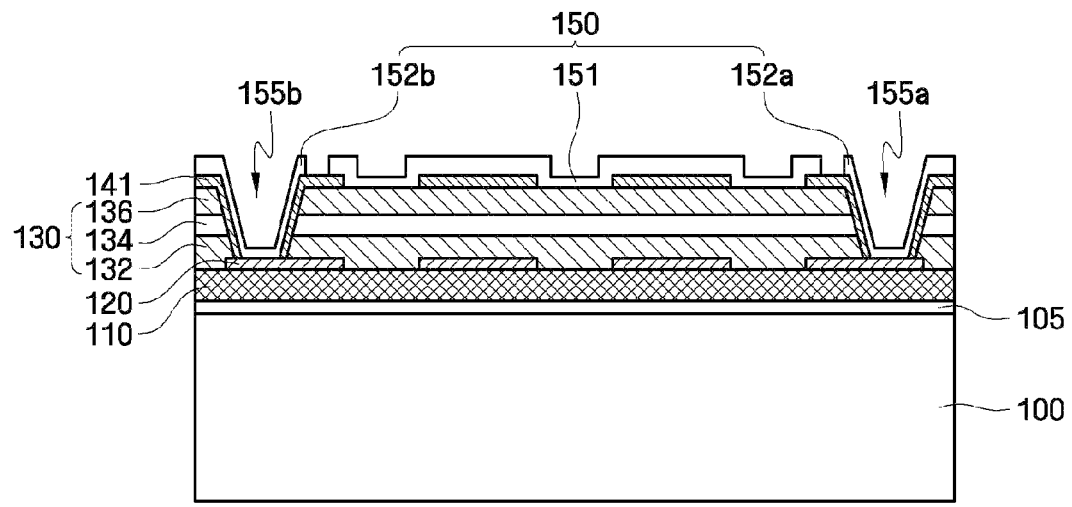

Referring to FIG. 27, a second pattern 150 is formed on the insulating pattern 141.

The second pattern 150 is formed such that a first region 151 which contacts the second semiconductor pattern 136 is separated from second regions 152 and 152b which contact the first pattern 120.

The second pattern 150 may be made of a material with high reflectivity in order to improve efficiency of light generated by the light-emitting structure 130. The second pattern 150 may be made of at least one of Ag and Al.

Figure 28:
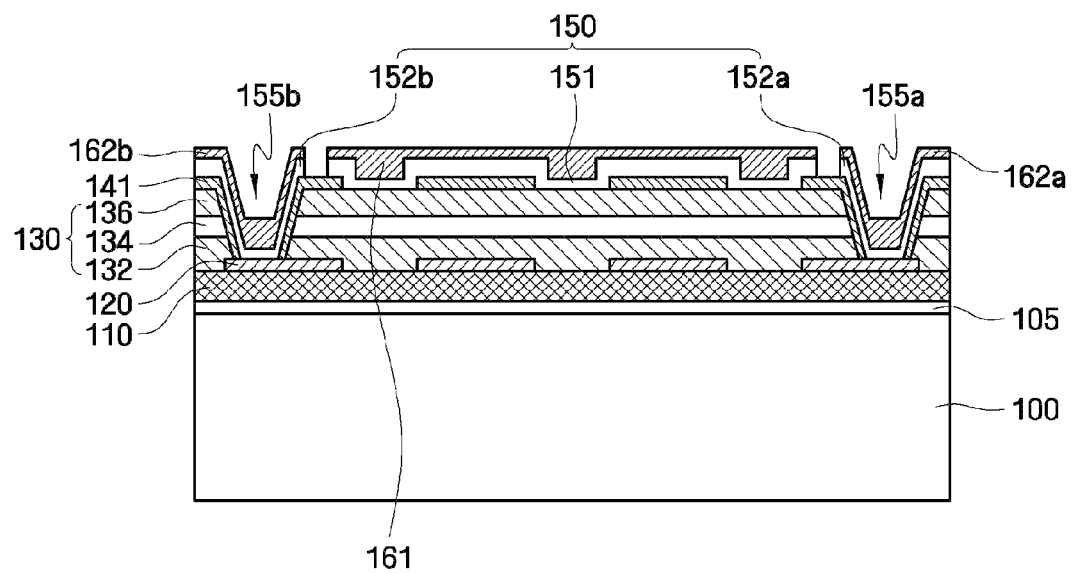

Referring to FIG. 28, bonding pads 161, 162a and 162b are formed on the second pattern 150.

The bonding pads 161, 162a and 162b may contain at least one of ITO, Zn, ZnO, Ag, Ti, Al, Au, Ni, $In_2O_3$, $SnO_2$, Cu, W, and Pt. For easier bonding, an upper surface of each of the bonding pads 161, 162a and 162b may be formed flat.

Figure 29:
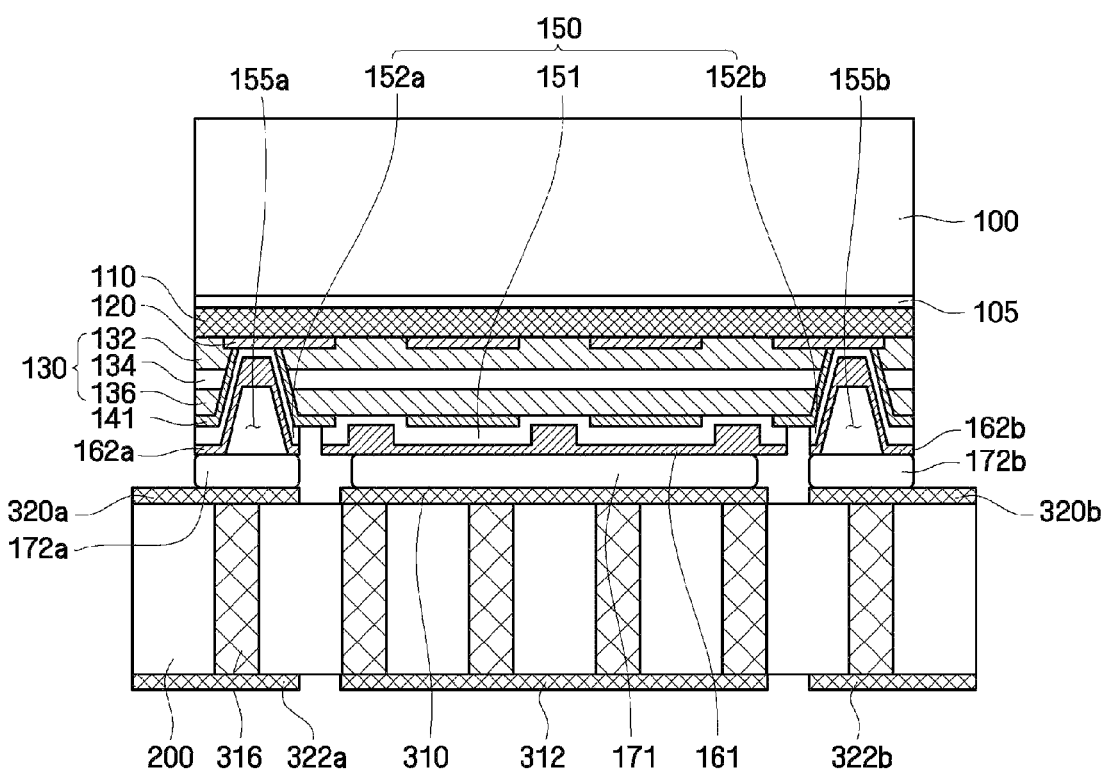

Referring to FIG. 29, intermediate material layers 171, 172a and 172b are formed on a circuit substrate 200, and the first pattern 120, the light-emitting structure 130, the insulating pattern 141 and the second pattern 150 stacked on the substrate 100 are bonded onto the circuit substrate 200.

The intermediate material layers 171, 172a and 172b may be a conductive material, e.g., a metal layer. The intermediate material layers 171, 172a and 172b formed as a metal layer may contain at least one of Au, Ag, Pt, Ni, Cu, Sn, Al, Pb, Cr, and Ti. That is, the metal layer may be a single layer of Au, Ag, Pt, Ni, Cu, Sn, Al, Pb, Cr or Ti, may be a laminate of the above materials, or may be a combination of the above materials. For example, the metal layer may be a single Au layer, a double Au/Sn layer, or a multi-layer formed by alternately stacking Au and Sn a number of times. The intermediate material layers 171, 172a and 172b may be a material having lower reflectivity than that of the material that forms the second pattern 150.

Next, the bonding pads 161, 162a and 162b formed on the substrate 100 are placed to face a bonding surface of the circuit substrate 200.

Then, the circuit substrate 200 and the substrate 100 are bonded to each other. For example, by heat treatment. The conductive substrate 200 and the substrate 100 may also be boned to each other by thermo-compression bonding.

If each of the intermediate material layers 171, 172a and 172b is a single Au layer, thermo-compression bonding may be performed at approximately 200 to 450° C., which can be adjusted by one of ordinary skill in the art.

Figure 30:
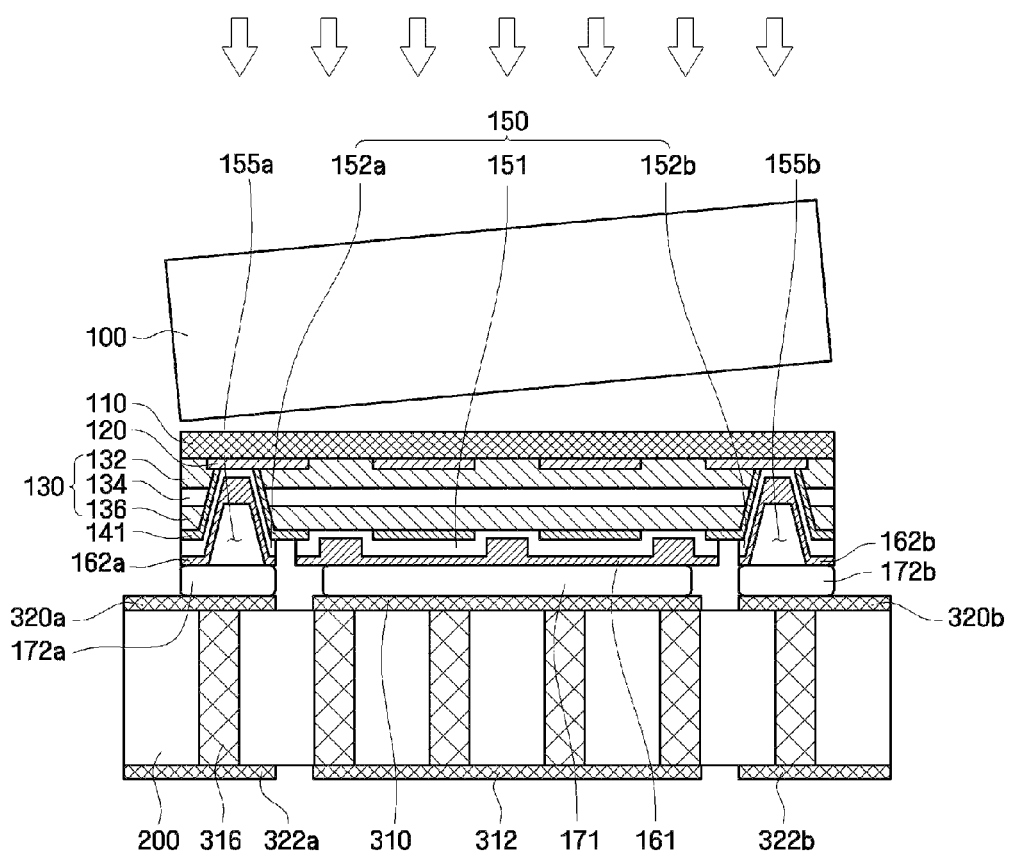

Referring to FIG. 30, the substrate 100 is etched or removed.

Here, the substrate 100 may be removed by an LLO process. Specifically, a laser beam may be irradiated from a side of the substrate 100. Since the area of the laser beam is smaller than that of the substrate 100, it scans over the substrate 100. The sacrificial layer 105 is etched or removed using the laser beam. Then, the substrate 100 starts to be lifted off from a portion to which the laser beam is irradiated.

To reduce, limit or prevent the light-emitting element from being damaged by the LLO process, the thickness of the substrate 100 may be reduced before the LLO process. As described above, the substrate 100 starts to be lifted off from a portion to which a laser beam is irradiated. Thus, a physical force created when the substrate 100 is lifted off can break or damage the light-emitting structure 130. However, if the thickness of the substrate 100 is limited or reduced by a chemical mechanical polishing (CMP) process before the LLO process, the physical force created when the substrate 100 is lifted off is limited or reduced, thereby reducing the damage to the light-emitting structure 130.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A method of fabricating a light-emitting element, the method comprising:
   forming a first pattern including conductive regions and non-conductive regions on a substrate, the non-conductive regions being defined by the conductive regions,
   forming a light-emitting structure on the substrate having the first pattern by sequentially stacking a first semiconductor pattern of a first conductivity type, a light-emitting pattern, and a second semiconductor pattern of a second conductivity type;
   forming an insulating pattern including insulating regions and non-insulating regions on the light-emitting structure, the non-insulating regions being defined by the insulating regions; and
   forming a second pattern in the non-insulating regions, wherein the insulating regions correspond respectively to the conductive regions such that at least one of the insulating regions is substantially the same width as at least one of the conductive regions.

2. The method of claim 1, wherein the first pattern is such that the conductive regions are in at least one of a dotted form, a mesh form, and a linear form.

3. The method of claim 1, wherein the first semiconductor pattern is formed on the first pattern by lateral epitaxial overgrowth.

4. The method of claim 1, further comprising:
   forming a contact hole in the light-emitting structure, the contact hole exposing one of the conductive regions.

5. The method of claim 4, wherein the second pattern includes a first region which contacts the light-emitting structure and the second pattern further includes a second region which contacts one of the conductive regions through the contact hole.

6. The method of claim 1, further comprising:
   forming a bonding pad on the second pattern.

7. The method of claim 1, wherein the insulating pattern is formed such that the non-insulating regions do not overlap the conductive regions.

8. The method of claim 1, further comprising:
   removing the substrate from the first pattern.

9. The method of claim 8, wherein the substrate is etched using a laser lift-off method.

10. A method of fabricating a light-emitting element, the method comprising:
    forming a first pattern including conductive regions and non-conductive regions on a substrate, the non-conductive regions being defined by the conductive regions,
    forming a light-emitting structure on the substrate having the first pattern by sequentially stacking a first semiconductor pattern of a first conductivity type, a light-emitting pattern, and a second semiconductor pattern of a second conductivity type;
    forming an insulating pattern including insulating regions and non-insulating regions on the light-emitting structure, the non-insulating regions being defined by the insulating regions; and
    forming a second pattern in the non-insulating regions, wherein the insulating regions correspond respectively to the conductive regions, and edges of the second pattern in the non-insulating regions are aligned below edges of the non-conductive regions having same latitude dimensions.

11. A method of fabricating a light-emitting element, the method comprising:
   forming a first pattern including conductive regions and non-conductive regions on a substrate, the non-conductive regions being defined by the conductive regions;
   forming a light-emitting structure on the substrate having the first pattern by sequentially stacking a first semiconductor pattern of a first conductivity type, a light-emitting pattern, and a second semiconductor pattern of a second conductivity type;
   forming an insulating pattern including insulating regions and non-insulating regions on the light-emitting structure, the non-insulating regions being defined by the insulating regions; and
   forming a second pattern in the non-insulating regions, wherein the insulating regions correspond respectively to the conductive regions, and the light-emitting structure contacts the first pattern and the insulating pattern.

* * * * *